(12) United States Patent
Richardson

(10) Patent No.: US 8,733,982 B2
(45) Date of Patent: May 27, 2014

(54) INTERNAL COLLECTING REFLECTOR OPTICS FOR LEDS

(75) Inventor: Brian Edward Richardson, Campbell, CA (US)

(73) Assignee: Rambus Delaware LLC, Brecksville, OH (US)

( * ) Notice: Subject to any disclaimer, the term of this patent is extended or adjusted under 35 U.S.C. 154(b) by 161 days.

(21) Appl. No.: 12/949,642

(22) Filed: Nov. 18, 2010

(65) Prior Publication Data

US 2011/0116284 A1    May 19, 2011

Related U.S. Application Data

(60) Provisional application No. 61/281,544, filed on Nov. 18, 2009.

(51) Int. Cl.
*H03L 5/00* (2006.01)
*H03K 5/08* (2006.01)

(52) U.S. Cl.
USPC ............. 362/327; 362/311.02; 362/555

(58) Field of Classification Search
USPC ............ 362/235, 244–246, 249.02, 311.02, 362/326–327, 555, 800
See application file for complete search history.

(56) References Cited

U.S. PATENT DOCUMENTS

| | | |
|---|---|---|
| 223,898 A | 1/1880 | Edison |
| 2,673,923 A | 3/1954 | Williams |
| 2,971,083 A | 2/1961 | Phillips et al. |
| 4,171,874 A | 10/1979 | Bigelow et al. |
| 4,172,631 A | 10/1979 | Yevick |
| 4,392,187 A | 7/1983 | Bornhorst |
| 4,420,796 A | 12/1983 | Mori |
| 4,431,966 A | 2/1984 | Pucciarello |
| 4,487,481 A | 12/1984 | Suzawa |
| 4,566,935 A | 1/1986 | Hornbeck |
| 4,596,992 A | 6/1986 | Hornbeck |
| 4,615,595 A | 10/1986 | Hornbeck |
| 4,618,216 A | 10/1986 | Suzawa |
| 4,662,746 A | 5/1987 | Hornbeck |
| 4,710,732 A | 12/1987 | Hornbeck |
| 4,737,896 A | 4/1988 | Mochizuki et al. |

(Continued)

FOREIGN PATENT DOCUMENTS

| | | |
|---|---|---|
| CN | 1701446 | 11/2005 |
| CN | 1147070 | 2/2010 |

(Continued)

OTHER PUBLICATIONS

International Search Report and the Written Opinion with mail date of Feb. 18, 2011, re Int'l Application No. PCT/US2010/001673.

(Continued)

*Primary Examiner* — Jason Moon Han
(74) *Attorney, Agent, or Firm* — Renner, Otto, Boisselle & Sklar, LLP

(57) ABSTRACT

An optical system is disclosed that uses an LED light source. The light output is coupled to an optic element formed from a material with a high refractive index. The coupling of the light to the high index material significantly reduces the cone angle of the light. The system is very efficient in that nearly all the light generated by the LED is directed to the intended subject.

20 Claims, 6 Drawing Sheets

(56) References Cited

U.S. PATENT DOCUMENTS

| | | | |
|---|---|---|---|
| 4,936,659 A | 6/1990 | Anderson et al. | |
| 4,956,619 A | 9/1990 | Hornbeck | |
| 4,972,306 A | 11/1990 | Bornhorst | |
| 4,974,122 A | 11/1990 | Shaw | |
| 5,028,939 A | 7/1991 | Hornbeck et al. | |
| 5,040,098 A | 8/1991 | Tanaka et al. | |
| 5,046,826 A | 9/1991 | Iwamoto et al. | |
| 5,057,974 A | 10/1991 | Mizobe | |
| 5,083,252 A | 1/1992 | McGuire | |
| 5,126,886 A | 6/1992 | Richardson et al. | |
| 5,217,285 A | 6/1993 | Sopori | |
| 5,221,987 A | 6/1993 | Laughlin | |
| 5,319,491 A | 6/1994 | Selbrede | |
| 5,359,691 A | 10/1994 | Tai et al. | |
| 5,396,350 A | 3/1995 | Beeson | |
| 5,414,599 A | 5/1995 | Kaneko et al. | |
| 5,467,208 A | 11/1995 | Kokawa et al. | |
| 5,528,720 A | 6/1996 | Winston et al. | |
| 5,631,895 A | 5/1997 | Okada et al. | |
| 5,825,548 A | 10/1998 | Bornhorst et al. | |
| 5,936,772 A | 8/1999 | Suzuki | |
| 5,953,469 A | 9/1999 | Zhou | |
| 5,995,690 A | 11/1999 | Kotz et al. | |
| 6,040,937 A | 3/2000 | Miles | |
| 6,048,081 A | 4/2000 | Richardson | |
| 6,167,182 A | 12/2000 | Shinohara et al. | |
| 6,350,041 B1 | 2/2002 | Tarsa | |
| 6,360,033 B1 | 3/2002 | Lee et al. | |
| 6,421,103 B2 | 7/2002 | Yamaguchi | |
| 6,421,104 B1 | 7/2002 | Richard | |
| 6,438,283 B1 | 8/2002 | Karaguleff et al. | |
| 6,502,961 B1 | 1/2003 | Richardson | |
| 6,565,233 B1 | 5/2003 | Richardson | |
| 6,674,562 B1 | 1/2004 | Miles | |
| 6,729,734 B2 | 5/2004 | Childers et al. | |
| 6,768,572 B2 | 7/2004 | Romanovsky | |
| 6,771,325 B1 | 8/2004 | Dewald et al. | |
| 6,824,270 B2 | 11/2004 | Kim et al. | |
| 6,867,896 B2 | 3/2005 | Miles | |
| 6,924,945 B1 | 8/2005 | Richardson | |
| 6,971,781 B2 * | 12/2005 | Guy | 362/576 |
| 6,974,232 B1 | 12/2005 | Richardson | |
| 6,991,355 B1 * | 1/2006 | Coushaine et al. | 362/555 |
| 7,080,932 B2 | 7/2006 | Keuper | |
| 7,123,216 B1 | 10/2006 | Miles | |
| 7,142,744 B2 | 11/2006 | Walter et al. | |
| 7,144,131 B2 | 12/2006 | Rains | |
| 7,177,498 B2 | 2/2007 | Cizek | |
| 7,286,296 B2 | 10/2007 | Chaves et al. | |
| 7,345,824 B2 | 3/2008 | Lubart | |
| 7,380,962 B2 | 6/2008 | Chaves et al. | |
| 7,445,360 B2 * | 11/2008 | Ikeda | 362/332 |
| 7,447,397 B1 | 11/2008 | Maki et al. | |
| 7,499,206 B1 | 3/2009 | Richardson | |
| 2002/0031294 A1 | 3/2002 | Takeda et al. | |
| 2002/0044720 A1 | 4/2002 | Brophy et al. | |
| 2002/0105709 A1 | 8/2002 | Whitehead et al. | |
| 2004/0076396 A1 | 4/2004 | Suga | |
| 2004/0109105 A1 | 6/2004 | Nagakubo | |
| 2005/0018147 A1 | 1/2005 | Lee et al. | |
| 2005/0057731 A1 | 3/2005 | Lee et al. | |
| 2005/0201100 A1 * | 9/2005 | Cassarly et al. | 362/317 |
| 2005/0207177 A1 | 9/2005 | Guy | |
| 2005/0221473 A1 | 10/2005 | Dubin et al. | |
| 2005/0243570 A1 | 11/2005 | Chaves | |
| 2005/0248827 A1 | 11/2005 | Starkweather et al. | |
| 2005/0270796 A1 | 12/2005 | Ichikawa et al. | |
| 2006/0070379 A1 | 4/2006 | Starkweather et al. | |
| 2007/0133224 A1 | 6/2007 | Parker | |
| 2007/0176887 A1 | 8/2007 | Uehara | |
| 2007/0211487 A1 | 9/2007 | Sormani | |
| 2008/0170296 A1 | 7/2008 | Chaves et al. | |
| 2008/0247169 A1 | 10/2008 | Zou | |
| 2009/0064993 A1 | 3/2009 | Ghosh et al. | |
| 2009/0116099 A1 | 5/2009 | Richardson | |
| 2009/0262368 A1 | 10/2009 | Leong | |
| 2010/0085773 A1 | 4/2010 | Richardson | |
| 2010/0172138 A1 | 7/2010 | Richardson | |
| 2010/0220492 A1 | 9/2010 | Richardson | |
| 2010/0315802 A1 | 12/2010 | Richardson | |
| 2010/0315836 A1 | 12/2010 | Richardson | |
| 2010/0328748 A1 | 12/2010 | Richardson | |
| 2011/0222309 A1 | 9/2011 | Shinohara | |
| 2012/0120676 A1 | 5/2012 | Richardson | |

FOREIGN PATENT DOCUMENTS

| | | |
|---|---|---|
| CN | 101644386 | 2/2010 |
| DE | 102007030186 A1 | 1/2009 |
| EP | 814300 A1 | 12/1997 |
| EP | 867747 A2 | 9/1998 |
| EP | 969305 A1 | 1/2000 |
| EP | 969306 A1 | 1/2000 |
| EP | 1215526 A1 | 6/2002 |
| EP | 1291833 A2 | 3/2003 |
| EP | 2045633 A1 | 4/2009 |
| GB | 663840 A | 12/1951 |
| JP | 10-041551 | 2/1998 |
| JP | 2000252525 | 9/2000 |
| JP | 2002223006 | 8/2002 |
| JP | 2002229017 A | 8/2002 |
| JP | 2003115204 | 4/2003 |
| JP | 2006241249 | 9/2006 |
| JP | 2009087850 | 4/2009 |
| JP | 2009244693 | 10/2009 |
| JP | 2010-123309 | 3/2010 |
| KR | 10-0972840 | 7/2010 |
| WO | 2004068183 A2 | 8/2004 |
| WO | WO-2005-071310 A1 | 8/2005 |
| WO | 2007-106020 | 9/2007 |
| WO | 2008060335 A1 | 5/2008 |
| WO | 2009024952 A2 | 2/2009 |

OTHER PUBLICATIONS

Information Disclosure Statement with mail date of Sep. 8, 2010, re U.S. Appl. No. 12/319,171.

International Search Report and the Written Opinion with mail date of Mar. 4, 2011, re Int'l Application No. PCT/US2010/001674.

Statement of Special Status in Support of Petition to Make Special under the Green Technology Pilot Program with mail date of Dec. 22, 2009, re U.S. Appl. No. 12/319,172.

Decision on Petition to Make Special under the Green Technology Pilot Program (Dismissed) with mail date of Feb. 22, 2010, re U.S. Appl. No. 12/319,172.

Information Disclosure Statement with mail date of Mar. 24, 2010. re U.S. Appl. No. 12/319,172.

Preliminary Amendment with mail date of Apr. 12, 2010, re U.S. Appl. No. 12/319,172.

Renewed Petition for Green Tech Pilot Program with mail date of Jun. 10, 2010, re U.S. Appl. No. 12/319,172.

Decision on Petition to Make Special under the Green Technology Pilot Program (Dismissed) with mail date of Jul. 13, 2010, re U.S. Appl. No. 12/319,172.

Preliminary Amendment with mail date of Aug. 13, 2010, re U.S. Appl. No. 12/319,172.

Renewed Petition for Green Tech Pilot Program with mail date of Aug. 13, 2010, re U.S. Appl. No. 12/319,172.

Decision on Petition to Make Special under the Green Technology Program (Denied) with mail date of Aug. 27, 2010, re U.S. Appl. No. 12/319,172.

Renewed Petition for Green Technology Pilot Program with mail date of Sep. 7, 2010, re U.S. Appl. No. 12/319,172.

Preliminary Amendment with mail date of Sep. 7, 2010, re U.S. Appl. No. 12/319,172.

Information Disclosure Statement with mail date of Sep. 8, 2010, re U.S. Appl. No. 12/319,172.

Decision on Petition to Make Special under the Green Technology Program (Denied) with mail date of Oct. 14, 2010, re U.S. Appl. No. 12/319,172.

(56) References Cited

OTHER PUBLICATIONS

Non-Final Office Action with mail date of Oct. 21, 2010, re U.S. Appl. No. 12/319,172.
Statement of Special Status in Support of Petition to Make Special under the Green Technology Pilot Program with mail date of Oct. 22, 2010, re U.S. Appl. No. 12/319,172.
Response to Office Action of Oct. 21, 2010 with mail date of Mar. 21, 2011, re U.S. Appl. No. 12/319,172.
International Search Report and the Written Opinion with mail date of Feb. 7, 2011, re Int'l Application No. PCT/US2010/001661.
International Search Report and the Written Opinion with mail date of Sep. 13, 2010, re Int'l. Application No. PCT/US2009/006763.
International Preliminary Report on Patentability dated May 31, 2012 re Int'l Application No. PCT/US10/057273.
International Search Report and Written Opinion dated Nov. 28, 2012 in International Application No. PCT/US2012/037250.
EP Search Report dated Feb. 21, 2014 in EP Application No. 10832199.3. 6 pages.

\* cited by examiner

INTERNAL COLLECTING REFLECTOR OPTICS FOR LEDS

CROSS-REFERENCE TO RELATED APPLICATIONS

This application claims the priority benefit of United States provisional application number 61/281,544, filed Nov. 18, 2009, the disclosure of which is incorporated herein by reference.

BACKGROUND OF THE INVENTION

1. Field of the Invention

This invention relates generally to the collection and control of light from a light emitting diode (LED). More specifically, the invention is directed to the control of the wide angular emission of light from an LED to create a highly controlled beam of light.

2. Background Art

Numerous products require efficient collection and control of light from a light source. A high degree of control is required to create a collimated beam of the type needed for searchlights used for live performances, special events, and illuminating tall structures. The searchlights use a xenon arc type lamp as a light source and a deep parabolic reflector to collect and control the light direction and beam angle. This method has been used for many years, even before the invention of the light bulb.

This type of prior art searchlight generally requires a reflector that is much larger than its arc gap. A 1000-watt xenon lamp generates most of its light within a sphere 1 mm in diameter. To create a highly collimated beam, a reflector with a diameter of 20 inches is typically used. Although xenon light sources create an enormous amount of light in a small area, efficiency of these types of lamps is poor. A 1000-watt lamp may only produce 35 lumens per watt of electrical energy. Another drawback with these lamps is the length of their life, which is only a few thousand hours. Finally, xenon light sources are filled with gas at a high pressure. Persons replacing xenon lamps need to wear protective clothing and a face shield when they are servicing searchlights.

Another disadvantage of the xenon light systems is the reduction in performance as a result of the collection of dirt on the optical surfaces. This collection is compounded by the fact that the lights typically require forced-air cooling. A xenon system has at least four surfaces where dirt can collect and reduce the output. The first of these surfaces is the surface of the lamp itself. The second is the surface of the reflector. The third and fourth are the inside and outside of the window. Only a small amount of dirt on any of these four surfaces significantly reduces the light output of the system The use of a deep parabolic reflector by searchlight manufacturers adds to the poor efficiency of the overall system. A lot of the light generated from the lamp exits the front of the open end of the parabolic reflector and doesn't contribute to the collimated beam created by the light that does strike the reflector.

Manufacturers of searchlights would like to use LEDs as the light sources for their searchlights. LEDs don't create light with as high intensity as the xenon light sources. The low intensity of LED light leads to the requirement of a much larger reflector for the same output as a xenon system. In some cases using an LED would require a reflector ten times the size of the reflector used by a system with a xenon light source. In summary, the main disadvantages of current xenon based light systems are their short life, the dangers of servicing the systems, and their low efficiency.

Optics systems to collect and control light from LEDs commonly combine a conventional reflector and refractive optics. A typical example of this type of system is shown in FIG. 1. Although this type of system is efficient in collecting all of the light from the LED, the ability to control the output is limited. The light that is collected by the reflector portion of the system has a generally uniform cone angle as it leaves the reflector. In this example the cone angle ranges from 3.9 degrees to 4.5 degrees. The refractive optics (i.e. the light transmitted through the lens) has a much greater cone angle, 41 degrees. Therefore, in searchlight systems, the light from the refractive optics does not contribute to the searchlight beam and creates spill light.

Another drawback inherent to the prior art system of FIG. 1 is that the output light comes from two sources, a lens and a reflector. The nature of the light from the lens is quite different from that from the reflector. It is therefore very difficult to optimize the output from both sources simultaneously. Output controlling measures that have a positive effect on the light output from the lens tend to have a negative effect on the light output from the reflector, and vice versa.

Another variation of conventional reflector optics is a lamp that locates an LED at the focal point of a parabolic reflector. The output normal to the surface of the LED is directed along the axis of the parabola. Light from the LED is emitted in a semispherical direction, + and −90 degrees from normal. The parabola collects all of the emitted light and directs most of the light in the intended direction. The LED and its mounting absorb some of the light that would, if not obstructed, go in the intended direction. This absorption occurs because the LED is in the output path of the light reflected by the parabola.

Electricity must be supplied to the LED to generate the light, which creates heat. To cool the LED, a heat pipe is used to conduct heat from the LED to a heat sink behind the reflector. These components also absorb some of the light, thereby reducing the efficiency of the lighting system even further.

The reflector in an LED light system needs to be large to collect the semispherical, ±90 degree output from the LED. If the cone angle could be reduced to less than ±45 the reflector could be much smaller. The output beam angle of the reflector of prior art products varies greatly as a function of the distance from the center of the reflector to the rim of the reflector. The variation in beam angle requires the reflector to be larger than would be required if the variation in beam angle over the diameter of the reflector was reduced.

There is therefore a need for a lighting system that is highly efficient, that is not as sensitive to dirt and dust, that provides a high degree of control of the output beam angle, and that is contained in a compact package.

SUMMARY OF THE CLAIMED INVENTION

Various embodiments of the present invention disclose an optical system with a directed output. The system includes at least one LED that provides a light source. The system further includes an optic element that reduces the cone angle of a light output of the light source. The light reflects off a reflective surface at an acute angle. The reflected light then forms an output light beam.

Other embodiments of the present invention may disclose a lighting system with a directed output including an array of optical systems. Each of the optical systems includes at least one LED that provides a light source and an optic element that reduces the cone angle of a light output of the light source.

The light contacts a reflective surface, and the light is reflected from the reflective surface at an acute angle. The reflected light then forms an output light beam. The light beams of the array of optical systems are combined to form a lighting system output beam.

Still other embodiments of the present invention disclose an optical system with a directed output including at least one LED that provides a light source. The light source is positioned in an output light path of the system. An optic element reduces the cone angle of a light output of the light source. A reflective surface reflects light form the light source at an acute angle. The reflected light forms an output light beam of the system.

DETAILED DESCRIPTION OF THE INVENTION

Various embodiments of the present invention disclose systems that control the direction and angle of a light output. The output of the systems reduces power consumption by directing a very high percentage of light generated by one or more LEDs specifically to the object designated to be lighted.

Figure 1:
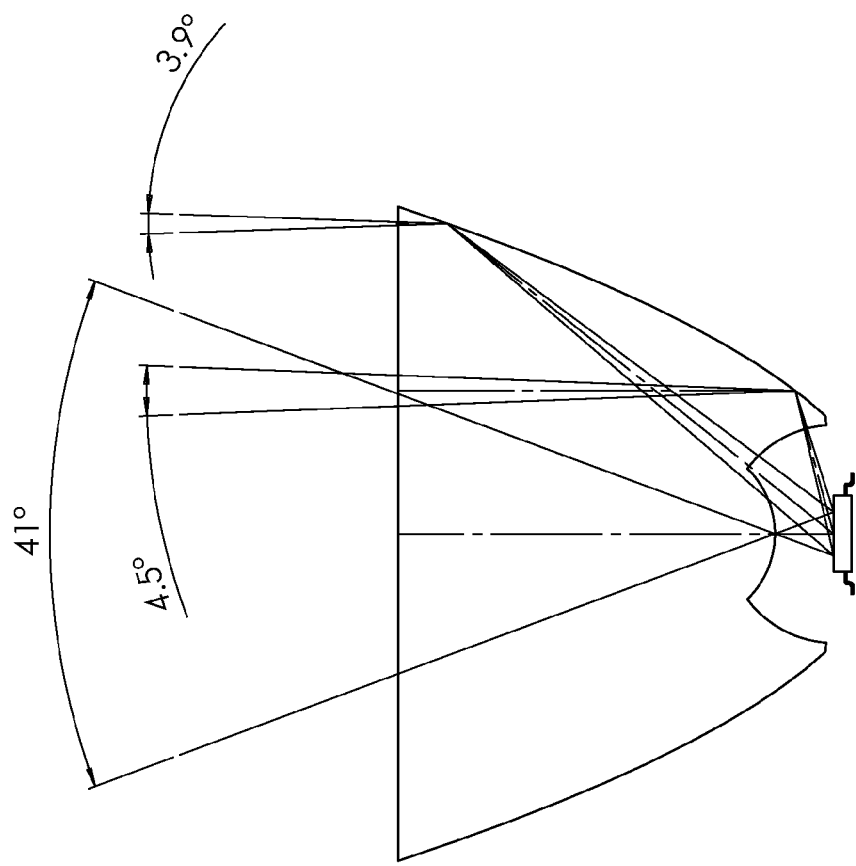
FIG. 1 is a side sectional view of prior art.
Figure 2:
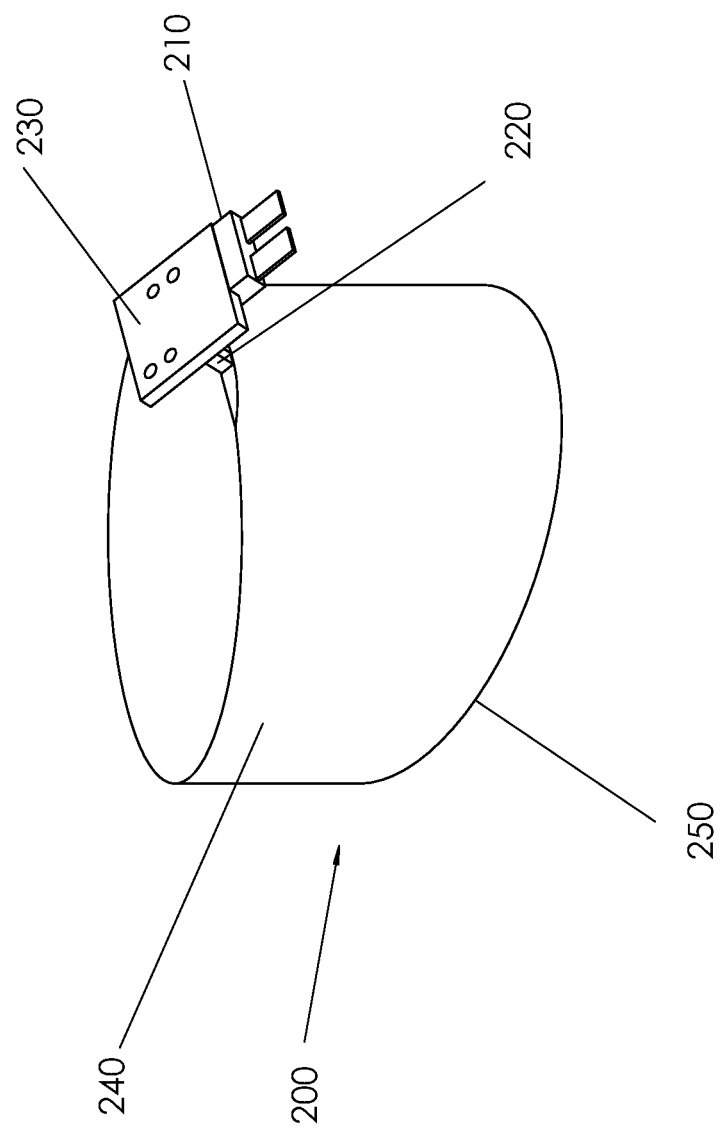
FIG. 2 is an isometric view of an exemplary optical system.
Figure 3:
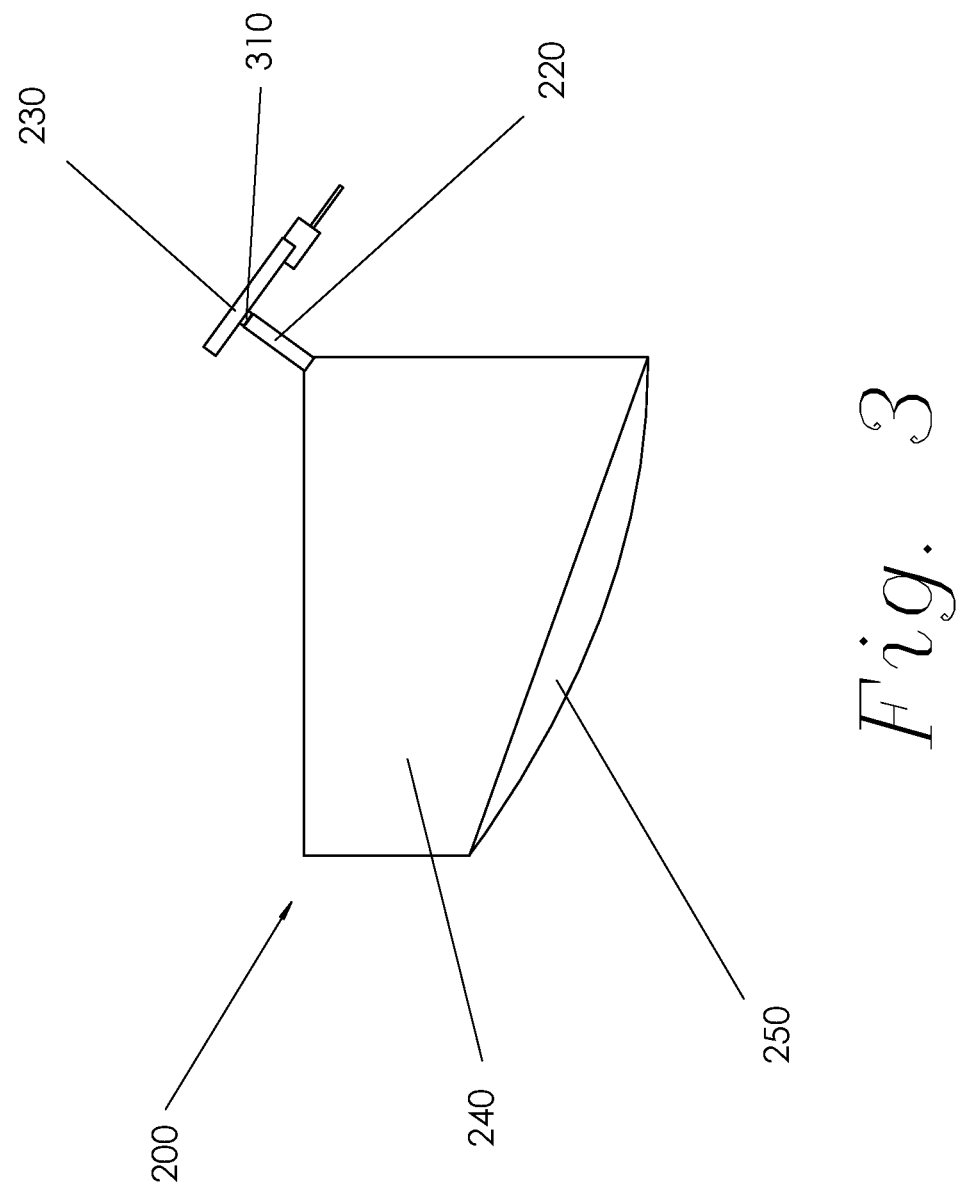
FIG. 3 is a side sectional view of an exemplary optical system.

Referring first to FIGS. 2 and 3, an optical system 200 includes an LED assembly 210 that is coupled to a light pipe 220. It will be understood by those skilled in the art that the type and size of the LED assembly 210 may vary with the particular optical system to be used in a given application. The LED assembly 210 is shown with a heat sink plate 230 that conducts heat from an LED die 310 (see FIG. 3).

While the LED die 310 is generally depicted in the several figures of the drawing as a single element, the LED die 310 may be formed from multiple dies. When multiple dies are used to form the LED die 310, the multiple dies may be bonded together.

Light pipe 220 may be implemented at least in part as a tube lined with a reflective material, an optical fiber, a hollow light guide, a fluorescence based system, and/or another device suitable for transporting light. The light pipe 220 may be coupled to the LED die 310, which may in turn be coupled to the heat sink plate 230. The light pipe 220 may be optically coupled to the emitting surface of the LED die 310. When the light pipe 220 and the emitting surface of the LED die 310 are optically coupled with either a gel or an adhesive, reflection losses from the body of the LED die 310 are reduced, as are the reflection losses at the mating surface of the light pipe 220 and the LED die 310. If reflection losses are not deemed critical, the LED assembly 210 may be constructed so that there is a narrow air gap between the LED die 310 and a first end of the light pipe 220.

A second end of the light pipe 220 may be optically coupled to an optic element 240. The optic element 240 may be cylindrical in cross section. The optical coupling of the light pipe 220 with the LED die 310 and the optic element 240 reduces light losses at the ends of the light pipe 220.

Light traveling within the light pipe 220 may travel within a range from approximately +42 degrees to approximately −42 degrees relative to the centerline of the light pipe 220. The actual angle of the light travel will depend on the index of refraction of the light pipe 220 and the specific output of the LED die 310.

The light pipe 220 conducts light to the optic element 240. The optic element 240 may be cylindrical in cross section, but other shapes may also be utilized. The optic element 240 may or may not have the same index of refraction as the light pipe 220. The optic element 240 may have a much greater index of refraction than the index of refraction of air, which is very close to 1. The index of refraction for acrylic is approximately 1.49 and for polycarbonate it is approximately 1.58. Some plastics have a higher refractive index, and glass materials may have much higher indexes of refraction. The higher the index of refraction of the material used to form the optic element 240, the narrower the cone angle of the light relative to a light pipe centerline 410 (see FIG. 4). For an optic element formed from a polycarbonate, the cone angle would be approximately ±39 degrees.

Figure 4:
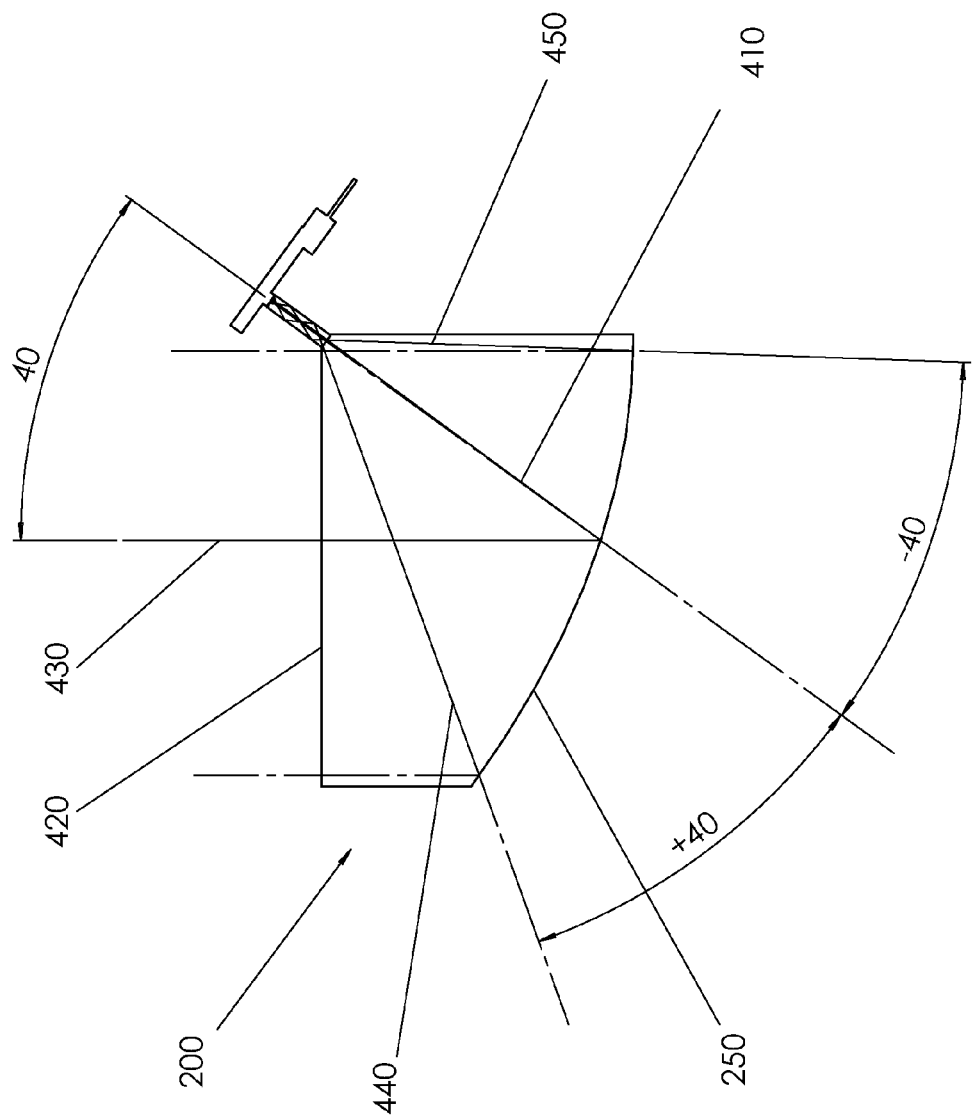
FIG. 4 is a side sectional view of an exemplary optical system showing light rays.

Referring now to FIG. 4, light from the LED assembly 210 that is directed along the light pipe centerline 410 will continue in that same direction when the light enters the optic element 240. Within the optic element 240, the light will eventually intersect an internal reflective surface 250. For a collimated beam the reflective surface 250 would be parabolic.

The shape of the internal reflective surface 250 may be varied according to the desired characteristics of the output beam. The output beam may be collimated, but different types of output beams may be desired. The reflective surface 250 may be ellipsoidal or aspheric to provide different effects for the output beam.

The reflective surface 250 creates an internal reflection effect in the optic element 240. Reflective surface 250 may be formed by coating the surface of the optic element 240 with a high reflectance material. The high reflectance material may be, for example, silver, aluminum, or a high performance interference coating. The selection of the specific material for the coating appropriate to the application is an engineering decision that takes into account the requirements of a particular application and the budget constraints of the project.

The intersection of the light pipe centerline 410 with the reflective surface 250 may be near the midpoint of the reflective surface 250. Constructing the system 200 so that the centerline 410 is near the midpoint of reflective surface 250 maximizes the amount of light that impinges on the reflective surface 250.

It may be noted that if the optic element used in the system is not formed from a high refractive index material, the cone angle of the light exiting the light pipe would be in the range ±90 degrees. The large cone angle would be a result of light being refracted at an output surface of the light pipe. A large cone angle would also result if the light pipe was made of acrylic and the non-high refractive index optic element was a hollow element filled with air.

The geometry of the optical system 200 may be such that the light enters the optic element 240 near where light exits the optic element 240. By locating the inlet near the outlet, the angle between an output centerline 430 and the light pipe centerline 410 may be minimal. The smaller the angle between the two centerlines 410, 430, the less difference there is between the length of a positive internal ray 440, a ray with a positive angle from the light pipe centerline 410, and the length of a negative internal ray 450, a ray with a negative angle from the light pipe centerline 410.

The length and geometry of the rays 440, 450 determine the output beam cone angle by their geometry. Reducing the angle between the light pipe centerline 410 and the output centerline 430 may reduce the size of the system 200. The greater the angle between the light pipe centerline 410 and the output centerline 430, the larger the system 200 may be to achieve the same output beam cone angle.

In the system depicted in FIG. 4, the optical lengths may vary from nominal approximately ±30%. If the angle between the two centerlines 410, 430 were much greater, for example 60 degrees, the differences in the nominal lengths would be closer to approximately ±60%. To maintain the same output beam cone angle the reflector would need to be much larger in overall size. In summary, the higher the index of refraction of the optic element 240, the more compact the system 200 may be. Further, the smaller the angle between the centerlines 410, 430, the more compact the system 200 may be.

Those skilled in the art will note that the light exiting the high refractive index optic element 240 at the output surface 420 may be refracted so that the light past the output surface 420 may have a greater cone angle than light within the optic element 240.

The output surface 420 may be flat. The output surface 420 may also have other geometries. The geometry of the output surface 420 may be selected based on the overall system requirements and the lighting effect desired. Other optic elements may be added to the system 200 downstream of the output surface 420.

If desired for a given installation, the light pipe 220 may be eliminated from the optical system 200. In this case, the LED assembly 210 may be directly optically coupled to the optic element 240. The optical performance of the system 200 may be maintained by reducing the size of the heat sink plate 230, or reconfiguring the heat sink plate 230. If the light pipe 230 is used, the length of the light pipe 220 is dependent on the size of the LED assembly 210 and its heat sink plate 230.

Figure 5:
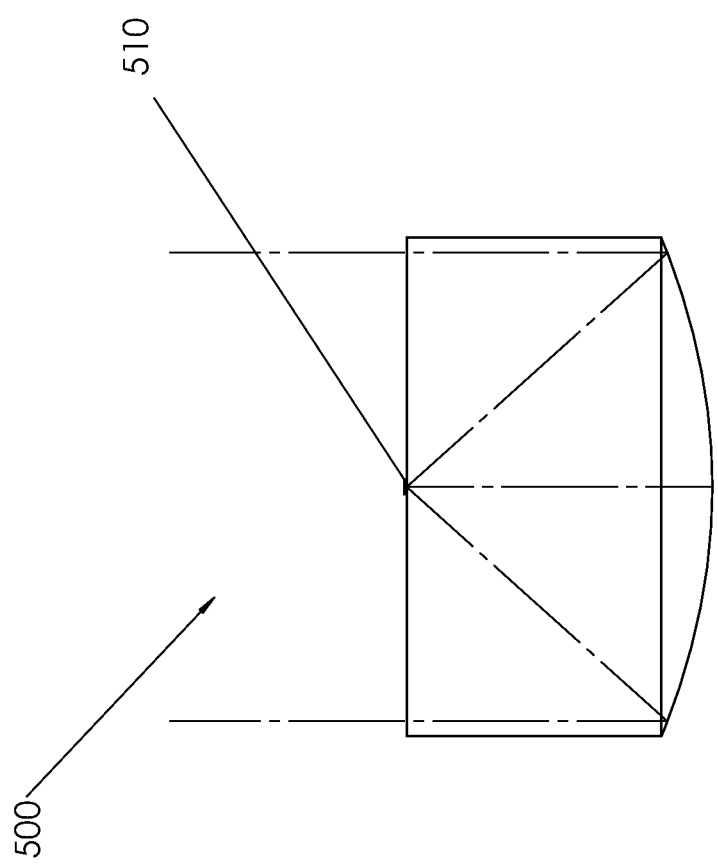
FIG. 5 is a side view of another exemplary optical system.

FIG. 5 illustrates a side view of another exemplary optical system 500. In optical system 500, the LED die 510 is located within an output light path. In this configuration, the centerlines of the input light path and the output light path are coincident, and the angle between them is zero. This configuration therefore may yield a system 500 of minimal size. Electricity and heat must be conducted to and from the LED 510. If the conducting components are large, they can absorb a significant amount of light. Therefore, high power systems might generally not be configured with LEDs in the output path.

Figure 6:
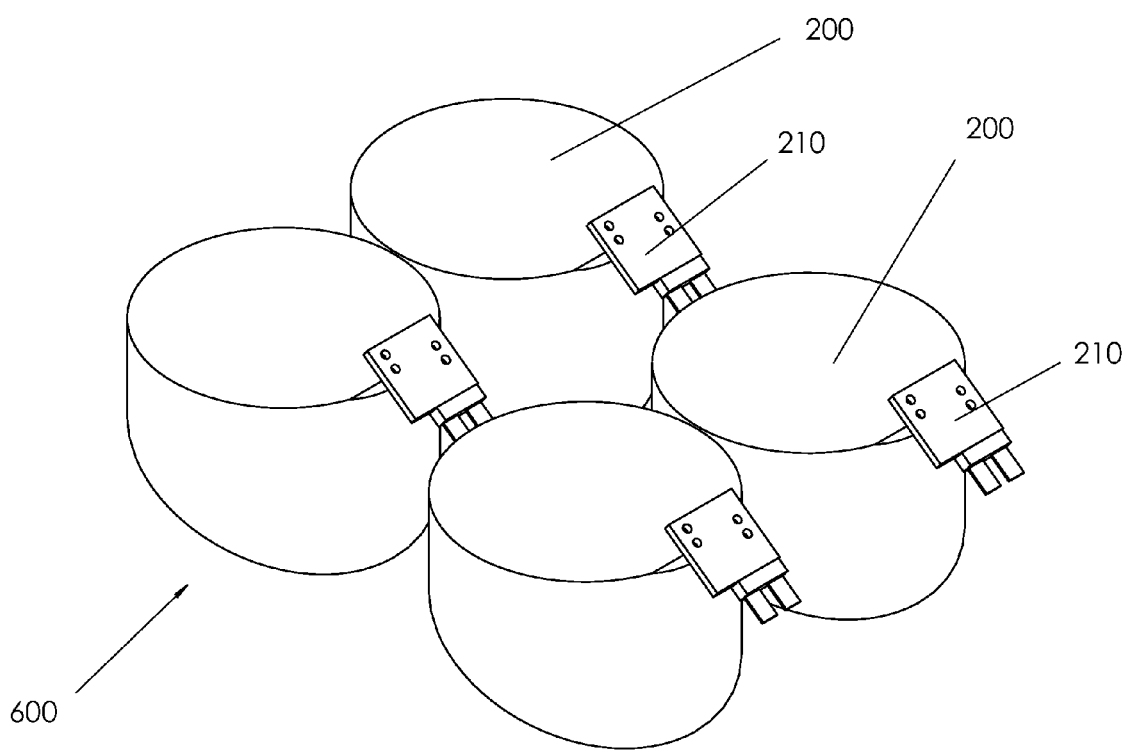
FIG. 6 is an isometric view of an exemplary array of optical systems.

FIG. 6 illustrates an isometric view of an exemplary array 600 of optical systems 200. The array 600 may be used for systems in which a large amount of light is required, such as a high powered searchlight. By using an array of optical systems 200, heat dissipation may be made simpler. By utilizing an array of smaller optical modules as opposed to a single large LED, the heat generated is spread over a larger area and is therefore easier to dissipate. The depth of an array 600 of optical systems 200 may be less than that required for an equivalent system using a single large LED or optic element. It will be recognized by those skilled in the art that the array 600 may be implemented in any of the configurations described herein.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

What is claimed is:

1. An optical system with a directed output, the optical system comprising:
    an entirely solid light-transmissive optic element comprising a light output surface and, opposite the light output surface, a reflective surface shaped to create an internal reflection effect, the solid optic element further comprising a side wall spacing apart the light output surface and the reflective surface;
    a light pipe extending from the solid optic element adjacent an edge of the light output surface, the light pipe having a proximal end optically coupled to the solid optic element and a distal end remote from the solid optic element; and
    an LED light source at and mounted in optical contact with the distal end of the light pipe, the light source and the light pipe directing the light output surface to direct light into the solid optic element towards the reflective surface, wherein the light from the light source is reflected by the reflective surface to form an output light beam that exits the solid optic element through the light output surface,
    wherein a length of the light pipe is shorter than a distance between the light output surface and the reflective surface.

2. The optical system of claim 1, wherein the solid optic element is configured such that an angle between the centerline of the light output by the light source and a centerline of light reflected from the reflective surface is no more than 60 degrees.

3. The optical system of claim 1, wherein the reflective surface is sized, angled relative to the light output surface, and offset from the light output surface such that positive and negative rays of a cone of light output from the light pipe are incident thereon adjacent an edge thereof.

4. The optical system of claim 1, wherein the light pipe has a center line angled at more than 0 degrees and at no more than 60 degrees relative to a normal to the light output surface.

5. The optical system of claim 1, wherein the light pipe comprises an optical fiber.

6. The optical system of claim 1, wherein the reflective surface is parabolic.

7. The optical system of claim 6, wherein the output light beam is collimated.

8. The optical system of claim 6, wherein the proximal end of the light pipe is located at a focal point of the parabolic reflector surface.

9. The optical system of claim 1, wherein the reflective surface is elliptical.

10. The optical system of claim 1, wherein the reflective surface is aspheric.

11. The optical system of claim 1, wherein an index of refraction of the optic element is no less than 1.3.

12. The optical system of claim 1, wherein the light source comprises more than one LED die.

13. A lighting system with a directed output, the lighting system comprising an array of optical systems in accordance with claim 1.

14. The optical system of claim 1, wherein the solid optic element is cylindrical.

15. The optical system of claim 1, wherein the solid optic element comprises one of acrylic or polycarbonate.

16. The optical system of claim 1, wherein:
    the solid optic element comprises a facet adjacent an edge of, and non-parallel to, the light output surface; and
    the proximal end of the light pipe is mounted in optical contact with the facet.

17. The optical system of claim 1, wherein the light from the light source that is directed into the solid optic element reflects off the reflective surface at acute angles to reduce a cone angle of the light output from the light source.

18. The optical system of claim 1, wherein an intersection of a centerline of the light pipe and the reflective surface is closer to a midpoint of the reflective surface than an edge of the reflective surface.

19. The optical system of claim 1, wherein a line normal to a tangent to a midpoint of the reflective surface is angled relative to normal to the light output surface and directed toward the proximal end of the light pipe.

20. The optical system of claim 1, wherein a line normal to a tangent to a midpoint of the reflective surface intersects the light output surface between a midpoint of the light output surface and the proximal end of the light pipe.

* * * * *